United States Patent
Vergöhl et al.

(10) Patent No.: US 9,803,276 B2
(45) Date of Patent: Oct. 31, 2017

(54) METHOD AND APPARATUS FOR PRODUCING LOW-PARTICLE LAYERS ON SUBSTRATES

(75) Inventors: Michael Vergöhl, Cremlingen (DE); Daniel Rademacher, Braunschweig (DE); Hans-Ulrich Kricheldorf, Bad Harzburg (DE); Günter Bräuer, Cremlingen (DE)

(73) Assignee: FRAUNHOER-GESELLSCHAFT ZUR FÖRDERUNG DER ANGEWANDTEN FORSHUNG E.V., Munich (DE)

( * ) Notice: Subject to any disclaimer, the term of this patent is extended or adjusted under 35 U.S.C. 154(b) by 95 days.

(21) Appl. No.: 14/234,019

(22) PCT Filed: Jul. 23, 2012

(86) PCT No.: PCT/EP2012/064404
§ 371 (c)(1),
(2), (4) Date: May 13, 2014

(87) PCT Pub. No.: WO2013/011149
PCT Pub. Date: Jan. 24, 2013

(65) Prior Publication Data
US 2014/0262752 A1    Sep. 18, 2014

(30) Foreign Application Priority Data
Jul. 21, 2011   (EP) .................... 11174871

(51) Int. Cl.
C23C 14/35        (2006.01)
H01J 37/34        (2006.01)
(Continued)

(52) U.S. Cl.
CPC ............ C23C 14/35 (2013.01); C23C 14/352 (2013.01); C23C 14/505 (2013.01);
(Continued)

(58) Field of Classification Search
CPC ..... C23C 14/35; C23C 14/352; C23C 14/505; C23C 14/564; H01J 37/3405; H01J 37/342
(Continued)

(56) References Cited

U.S. PATENT DOCUMENTS 4,374,722 A * 2/1983 Zega ................... C23C 14/3407
                                                              204/192.12
4,572,842 A * 2/1986 Dietrich .............. H01J 37/3405
                                                              118/50.1
(Continued)

FOREIGN PATENT DOCUMENTS

DE      103 47 521 A1   6/2004
DE  10 2007 016029 A1  10/2008

OTHER PUBLICATIONS

Dodd et al., "Negative Ion Density Measurements in Reactive Magnetron Sputtering", *Plasma Process. Polym.*, 6, pp. 615-619 (2009).
(Continued)

*Primary Examiner* — Rodney McDonald
(74) *Attorney, Agent, or Firm* — Leydig, Voit & Mayer, Ltd.

(57) ABSTRACT

The invention relates to methods and devices for producing one or more low-particle layers on substrates in a vacuum. The layers are deposited onto the substrate from a cylindrical source material, optionally together with a reactive gas component, by means of magnetron sputtering. The layer is deposited against the force of gravity in a sputter-up method. During the method or within the device, the structure or stochiometric atomic composition of the layers can optionally be modified using a plasma source. Multiple sputtering sources with different source materials can be provided in the device such that multiple layers of different composi-
(Continued)

tions can be applied on the substrate at a high speed in one process.

22 Claims, 3 Drawing Sheets

(51) Int. Cl.
*C23C 14/50* (2006.01)
*C23C 14/56* (2006.01)
(52) U.S. Cl.
CPC .......... *C23C 14/564* (2013.01); *H01J 37/342* (2013.01); *H01J 37/3405* (2013.01)
(58) Field of Classification Search
USPC ............ 204/298.26, 192.12, 298.11, 298.21, 204/298.22, 298.23, 298.28
See application file for complete search history.

(56) References Cited

U.S. PATENT DOCUMENTS

| | | | | |
|---|---|---|---|---|
| 4,793,908 A * | 12/1988 | Scott | ........................ | C23C 14/46 204/192.11 |
| 4,988,422 A * | 1/1991 | Wirz | ........................ | C23C 14/35 204/192.15 |
| 5,525,199 A * | 6/1996 | Scobey | ............... | C23C 14/0047 204/192.12 |
| 5,656,138 A * | 8/1997 | Scobey | ............... | C23C 14/0047 204/192.12 |
| 5,851,356 A | 12/1998 | Banning et al. | | |
| 6,197,165 B1 * | 3/2001 | Drewery | ............... | C23C 14/345 204/192.12 |
| 6,964,731 B1 * | 11/2005 | Krisko | ................. | C03C 17/245 204/192.12 |
| 7,923,114 B2 | 4/2011 | Myli et al. | | |
| 2009/0065741 A1 | 3/2009 | Walls et al. | | |
| 2010/0163406 A1 * | 7/2010 | Le | .......................... | C23C 14/08 204/192.29 |

OTHER PUBLICATIONS

Ngaruiya, "Fundamental Processes in Growth of Reactive DC Magnetron Sputtered Thin Films", Dissertation, RWTH Aachen (2004).
Rademacher et al., "New sputtering concept for optical precision coatings," Advances in Optical Thin Films VI, Michel Leguime et al., editors; *Proc. of SPIE*, vol. 8158, pp. 816800-816807 (2011).
Vergöhl et al., "Particle Generation during Pulsed Reactive Magnetron Sputtering of SiO2 with Cylindrical and Planar Cathodes," Conference Paper in Optical Interference Coatings, OSA Technical Digest (Optical Society of America, 2010), paper TuD3, Tucson, Arizona (Jun. 6-11, 2010).
European Patent Office, International Search Report in International Application No. PCT/EP/2012/064404 (Aug. 21, 2012).
European Patent Office, International Preliminary Report on Patentability in International Application No. PCT/EP/2012/064404 (Jan. 23, 2014).
"Bekanntmachung ("Notice") No. 261916-2009-DE", European Communities—Services,—Negotiated procedure, Supplement to the Official Journal of the European Union, http://ted.europa.edu/udl?uri=TED:NOTICE:261916-2009:TEXT:DE:HTML, 5 pgs. (Sep. 22, 2009).
Canadian Intellectual Property Office, Office Action in Canadian Application No. 2,842,253 (Apr. 12, 2017) 8 pp.
Japanese Patent Office, Decision of Rejection in Japanese Application No. 2014-520689 (Apr. 13, 2017) 7 pp.

* cited by examiner

METHOD AND APPARATUS FOR PRODUCING LOW-PARTICLE LAYERS ON SUBSTRATES

CROSS-REFERENCE TO RELATED APPLICATIONS

This patent application is the U.S. national phase of International Application No. PCT/EP2012/064404, filed on Jul. 23, 2012, which claims the benefit of European Patent Application No. 11174871.1, filed Jul. 21, 2011, the disclosures of which are incorporated by reference.

The invention relates to methods and apparatus for producing one or more low-particle layers on substrates in a vacuum. The layers are applied to the substrate from a cylindrical source material, optionally together with a reactive gas component, by magnetron sputtering. The application of the layer takes place against gravity in a so-called "sputter-up" process. The layers can optionally be modified in their structure or in their stoichiometric atomic composition by a plasma source within the process or within the apparatus. A plurality of sputter sources having different source materials can be provided in the apparatus so that a plurality of layers of different composition can be applied to the substrate at high speed in one process.

Optical precision filters are a key component of many industrial products of optical technologies. Applications range from laser engineering to medical engineering and bioengineering, to the display industry and automotive industry, right up to the solar industry. The demand for better, more flexible and simultaneously economic production processes for optical precision coatings is growing due to the constantly increasing technological demands and due to the increasing competition from low-wage countries. Current processes are increasingly coming up against technical boundaries when particularly high demands are made: Increasing discards, too short a long-term stability as well as the non-realizability of technical specifications reduce the cost-effectiveness and impede the introduction of new products.

Optical thin-film systems which utilize the principle of interference, e.g. for laser engineering, medical engineering and bioengineering, display engineering and automotive engineering, right up to the solar industry, in this respect require an observation of the specified filter properties which is as precise as possible as well as low absorptions and losses in the optical filter. In order in particular to observe the required minimal losses, it is absolutely necessary to minimize the contamination of the surfaces with particles since they can be the cause for scattering, absorption and low destruction thresholds (e.g. in the area of laser applications).

The layer properties to be achieved in this respect often require mutually contradictory process conditions. For instance, a high layer hardness and a stable coating having a very smooth surface (without a temperature dependence of the edges) as a rule correlate with compressive layer stresses, while layers without stress are usually rough and display a high dependency on temperature and humidity (spectral shift).

The great importance of the relationship of energetic particles (ions, neutral particles, radicals) with the layer growth process and thus with the layer properties was recognized at an early time: The morphology and thus also the layer properties in plasma coating processes are substantially determined by the type and by the energy distribution of both ions and neutral particles, with the particle energies of ions and neutral particles being able to vary greatly in dependence on the plasma conditions.

The optical properties are also influenced by the particle bombardment (e.g. with sputtering gas particles) of the growing layer. The incorporation of argon in oxide or fluoride layers, for example, effects an increased absorption.

The possibility of influencing the ion energies and the neutral particle energies and their densities is of great interest for the production and optimization of optical layers. Energetic neutral particles which impact the growing layer can induce Frenkel defects, for example (Hisashi Arakaki, Kazutoshi Ohashi and Tomoko Sudou, "Sputter-induced-defects in Zn-doped GaAs Schottky diodes", Semicond. Sci. Technol. 19, No. 1 (January 2004), p. 127-132). Nanodefects are playing an ever greater role in high-performance optics for ultrashort pulse laser applications or UV laser applications.

U.S. Pat. No. 5,525,199, (Corning OCA; "Reactive magnetron sputtering apparatus and method") describes a sputtering method and a sputtering apparatus in vacuum having a process pressure of $5 \cdot 10^{-5}$-$1.5 \cdot 10^{-4}$ Torr (=$6.7 \cdot 10^{-5}$-$2.0 \cdot 10^{-4}$ mbar). The spacing of the target from the substrate amounts to 16" (=40 cm).

The same applies to U.S. Pat. No. 5,851,356 (Corning OCA: "Low pressure reactive magnetron sputtering and method"), which describes a similar apparatus and a similar method. The process pressure range of this apparatus is located between $5 \cdot 10^{-5}$-4.2 $10^{-4}$ Torr(=$6.7 \cdot 10^{-5}$-$5.6 \cdot 10^{-4}$ mbar). The spacing from the target is likewise 16".

On the regulating of the processes in accordance with the prior art, a time constant can be achieved of approximately 20 to 30 milliseconds.

One disadvantage of this dynamic stabilization is that even with an ideal regulation low residual fluctuations of the process conditions and thus also of the stoichiometry of the layer cannot be avoided which can result in small inhomogeneities and thus in loss mechanisms. These inhomogeneities can, for example, cause an optical loss (e.g. loss in intensity), deviations in dispersion and/or deviations in absorption. Such inhomogeneities in particular give rise to serious problems with very high-quality optical layers.

The approach of sputtering very thin, substoichiometric or metallic layers which are post-oxidized separately in an oxygen plasma is therefore pursued in the prior art. The advantage of this method likewise lies in the largely metallic surface of the target. This production process requires a plant technology with a separate plasma source and a substrate movement in the process (Scherer, M., J. Pistner, et al. (2004), "Innovative Production of High Quality Optical Coatings for Applications in Optics and Optoelectronics", 47th Annual Technical Conference Proceedings of the Society of Vacuum Coaters, 179, 2004). Very thin layers (1-2 Å) are oxidized in this process in each case.

In particular turntable plants such as are described in DE 103 47 521 A1 are suitable for this process since here the stations for the coating and the station for the post-oxidization can be moved to after one another. The apparatus and the method of DE 103 47 521 A1 are provided for a "sputtering down". In this arrangement, the source material is deposited on the substrate using gravity from the top to the bottom. The particle flow is substantially characterized by the start pulse, impacts and diffusion of the particles from source material. The heavier the particles are, the greater the effect of the force of gravity on the particles. In the "sputter down" process, heavy particles are accelerated more onto the substrate by gravity. One disadvantage of the "sputter down" process is consequently that particles are accelerated in the direction of the substrate by gravity and not away from the substrate. Particles in the "sputter down" process can thus arrive on the substrate without impediment. The influence of the particles on the quality of the product is neglected in this respect.

The question of particles is, however, of high practical importance in coating processes. Particles or also defects in general on the substrate degrade the coating and result in rejects as a rule. This question is becoming more and more important as part of the growing demands and increasing miniaturization.

It was therefore the object of the present invention to provide an improved method and an improved apparatus for coating substrates.

This object is achieved by the features of the method and apparatus for producing one or more low-particle layers on substrates in vacuum described herein, and the advantageous developments thereof.

In accordance with the invention, a method is provided for producing low-particle layers on moved substrates in a vacuum chamber by means of at least one magnetron sputtering device, wherein the layers are formed from cylindrical source material, optionally together with a component of reactive gas, in which method the following steps are provided:
  immobilizing the substrate by means of a substrate holder on a turntable;
  depositing at least one layer of source material on the substrate using sputtering gas, optionally together with a component of reactive gas, in at least one magnetron sputtering device;
  wherein the turntable rotates such that a magnetron sputtering device is controlled and the cylindrical source material is deposited onto the substrate against gravity (i.e. upwardly).

At least one plasma source can be used in the method in accordance with the invention. The plasma source can pretreat the surface of the substrate (e.g. cleaning the surface) via the effect of plasma, optionally together with reactive gas. Optionally, the structure and/or the stoichiometry of the layer can be modified using the plasma effect of a plasma source, optionally together with reactive gas.

If at least one plasma source is used in a preferred embodiment of the method, the at least one plasma source can be controlled using the turntable.

Magnetron sputtering sources have proved to be extremely efficient coating tools in the past few years to produce thin-film systems on an industrial scale.

In the method in accordance with the invention, magnetron sputtering sources having cylindrical source material are used. Cylindrical source material (=cylindrical targets), preferably in the form of a cylindrical electrode, are in particular advantageous for optical coatings and the demands on layer homogeneity and freedom from particles associated therewith.

With cylindrical sources, the problem of planar targets is not present that an erosion trench forms at the surface of the target which results in a change in the layer thickness distribution. In principle, an ideal layer thickness distribution over the total service life of the target can be maintained by cylindrical sources. In addition, the throughput with cylindrical sources is increased over planar sources and the process has a higher long-term stability.

The magnetron sputtering sources are used in a so-called "sputter-up" arrangement. "Sputter-up" means that the cylindrical source material is deposited (onto the substrate) against gravity, i.e. upwardly. The advantage of this method is that the force of gravity has a greater effect on heavy particles than on light particles. Heavy particles are consequently accelerated more in the direction of gravity, i.e. downwardly. The particles are thereby accelerated away from the substrate and are hindered from being deposited as an interference factor on the target (substrate).

The productivity of the coating process increases due to the "sputter-up" arrangement; in particular the quality of the coated components is thereby increased. Further important reasons for the "sputter-up" arrangement with cylindrical magnetron electrodes (targets) are the long-term stability of the sputtering process and an arc-free environment due to the absence of charge on the surface of the target. With planar targets, only a region of the target is removed by the sputtering; in addition, redeposition occurs. A charge can accumulate on the deposited dielectric layer until an electrical breakdown (arcing) occurs. Cylindrical sources (targets) do not have a redeposition zone. This has the further advantage with reactive processes that a higher process cleanliness results. Furthermore, the sputtering off characteristic of the target does not vary due to the homogeneous removal of a cylindrical target. This makes the use of shields simpler and the shields can be used over the total target service life (higher long-term stability).

Planar targets in particular have a further disadvantage over cylindrical targets in the "sputter-up" configuration. Particles generated by planar source materials (targets) can trigger a short-circuit in that they are incident into the dark space of the target. This would in particular destroy the total batch with coating concepts which are based on turntable arrangements. Since cylindrical sources do not have a dark space, they are essentially preferred over planar sources in the "sputter-up" configuration with a turntable arrangement.

In the method in accordance with the invention and in the apparatus in accordance with the invention, at least one plasma source is optionally used for treating the substrate. An important goal of this plasma treatment is a pretreatment of the substrate before the actual coating by the immediate build-up of organic compounds on the substrate. The aim is to pretreat the substrate so that it is as free as possible of foreign particles. The quality of the sputtered layers can thereby be substantially improved with respect to scattering, absorption and destruction thresholds. As a result, flat substrates (e.g. lenses) can be provided with substantially improved properties by the method in accordance with the invention. The method in accordance with the invention is specifically particularly advantageous for laser systems, edge filters, fluorescence filters, bandpass filters, reflectors for different wavelengths, anti-reflection coating, mirror-coating, cavity filters and/or UV-IR cuts.

A boundary layer can form between the layers on the coating of a substrate with a plurality of layers. In the method in accordance with the invention, the boundary layer can be oversaturated with $O_2$ and/or a layer can be fully reactively deposited. This procedure can prevent a boundary layer from arising between two layers. Furthermore, a reduction in the size of boundary layers between two layers is aimed for by the optional treatment with plasma, with mixtures of the two materials impacting the boundary layer forming at said two layers. The expansion of the boundary surface can also be prevented by the action of the plasma source. This not only reduces optical losses, but also ensures a better "faithfulness to design".

The vacuum chamber within the magnetron sputtering device can have a process pressure in the range from $3 \cdot 10^{-4}$-$5 \cdot 10^{-2}$ mbar in the method in accordance with the invention and/or in the apparatus in accordance with the invention.

The partial pressure of the sputtering gas and/or of the reactive gas can be regulated or stabilized via a generator in the magnetron sputtering device, preferably via a regulation of the generator power, of the generator voltage and/or of the generator current.

The advantage of this regulation is that no dielectric layer is removed from the target in the method in accordance with the invention, but the target is rather not covered by a dielectric layer at any time. This can be realized, for example, in that metallic targets are operated in the so-called "transition mode". The cylindrical source material (target) is here permanently in a metallic, oxide-free state due to a suitable regulation of the generator, while sufficient oxygen for the oxidation of the growing layer is present in the process space. The above-named control variables are as a rule realized on the oxygen partial pressure or the voltage of the generator or of the target. The deposition of stoichiometric layers can thus be achieved at a high deposition rate in the process, while the interfering influences of particles is minimized, i.e. a very low number of particles is achieved.

The turntable of the apparatus in the process can rotate at a speed of 1-500 r.p.m.$^{-1}$, preferably 150-300 r.p.m.$^{-1}$. A fast rotation of the turntable in the range from 150-300 r.p.m.$^{-1}$ can be advantageous for a high throughput and a high precision. A time constant of around 500 µs up to some milliseconds can be realized by the high rotation speeds.

In a further embodiment of the method, the plasma source serves to reduce the layer stress in a layer on the substrate, preferably by minimizing the boundary layer thickness and/or by minimizing the boundary layer extent between individual layers on the substrate.

Layer stress or layer tensions can be explained within the framework of the "Atomic Peening Model" (Windischmann, H., (1992), "Intrinsic Stress in Sputter-Deposited Thin Films", Critical Reviews in Solid State and Materials Sciences, 17(6), p. 547-596) by the bombardment of the layer with energetic particles. Negatively charged oxygen ions such as in particular occur in reactive processes can also have a substantial influence on the layer growth. The significance of negative ions on layer growth has recently been increasingly discussed (R. Dodd, S. You, P. Bryant, J. W. Bradley, "Negative Ion Density Measurements in Reactive Magnetron Sputtering", Plasma Process. Polym. 2009, 6, p. 615-619).

Reflected argon particles were recognized as the cause of layer stress by Windischmann, H., (1992), "Intrinsic Stress in Sputter-Deposited Thin Films", Critical Reviews in Solid State and Materials Sciences, 17(6), p. 547-596, at AlN layers as well as at BC layers by Jacobsohn (L. G. Jacobsohn, R. D. Averitt, and M. Nastasi, "The role of trapped Ar atoms in the mechanical properties of boron carbide films deposited by dc-magnetron sputtering, J. Vac. Sci. Technol. A 21(5) (2003), p. 1639). Other gases (e.g. the lighter krypton instead of argon) admittedly result in lower stresses, but likewise in lower hardnesses.

In a further preferred embodiment, the plasma source satisfies one of the following functions:
  setting the temperature of the substrate;
  setting the microstructure of a layer on the substrate;
  cleaning the substrate, preferably by reducing organic contaminants on the substrate;
  activating the surface of the substrate and/or of a layer on the substrate.

In the method in accordance with the invention, the thickness of the layer on the substrate can be monitored by optical transmission monitoring, optionally via polarized transmission measurements, optical reflection monitoring, optionally via polarized reflection measurements, optical absorption monitoring and/or single wavelength ellipsometry or spectral ellipsometry.

An increased deposition temperature or substrate temperature is required for the deposition of certain layers. For this purpose, a heatable element is attached to the cover of the apparatus in a preferred embodiment. In this respect, the temperature of the heatable element at the cover of the apparatus is preferably set in dependence on the layer to be produced. The temperature can in this respect also be varied during the coating process to correspond to the demands on a specific layer; the temperature of the heatable element at the cover can be set to a value from 50 to 450° C. The temperature of the substrate can thereby be set in a range from room temperature (approx. 20° C.) to 300° C. The cover is thermally insulated from the remaining apparatus.

The apparatus in accordance with the invention for producing low-particle layers on at least one moved substrate in vacuum by means of magnetron atomization comprises the following features:
  at least one magnetron sputtering device having cylindrical source material, a generator, sputtering gas and optionally reactive gas;
  a cover, preferably with a heatable element; and
  a turntable with at least one substrate holder.

The apparatus is characterized in that the cover closes the apparatus in a gas-tight manner and the turntable closes the at least one magnetron sputtering device in a gas-tight manner. The at least one magnetron sputtering device is furthermore aligned so that it deposits source material in the direction of the substrate, optionally together with a component of reactive gas, against gravity.

In a preferred embodiment, the apparatus comprises at least one plasma source which optionally has reactive gas. In this case, the at least one plasma source can be closed in a gas-tight manner by the turntable of the apparatus with an effective gas compartment separation for gases of 1:25, preferably of 1:100. In a preferred embodiment of the apparatus, the turntable is positioned above the plasma source.

The turntable is preferably arranged above the magnetron sputtering device and, if present in a preferred embodiment, above the plasma source for the deposition of source material in the direction of the substrate against gravity.

Furthermore, the apparatus in accordance with the invention is characterized in that the magnetron sputtering device comprises at least one magnetron electrode of source material (=target). The magnetron electrode can comprise or consist of a target comprising or consisting of a material selected from the group comprising ceramic material or material mixtures, thermally sprayed material or material mixtures, crystalline material, metallic material or material mixtures and/or a material containing an oxide, or also mixtures thereof.

The magnetron electrode preferably comprises a target comprising or consisting of ceramic material. The already mentioned compressive stresses in optical layers are of high importance. They result in deflections in the optics or also in a detachment of the layer or even in a break of the substrate. The approach of reducing the layer tension in the optics is provided by ceramic targets. Whereas in purely reactive processes with metallic targets an influence of negatively charged oxygen ions can be found which result in high layer stresses (J. M. Ngaruiya, "Fundamental Processes in Growth of Reactive DC Magnetron Sputtered Thin Films", Dissertation, RWTH Aachen (2004)), an increased molecular sputtering was found at ceramic targets (e.g. AZO, aluminum-doped zinc oxide) (F. Richter, T. Welzel, R. Kleinhempel, T. Dunger, T. Knoth, M. Dimer. F. Milde, "Ion energy distributions in AZO magnetron sputtering from planar and rotatable magnetrons", Surface & Coatings Technology 204 (2009), p. 845-849) so that it can be expected that the energy input is optimized and layer stresses are to be reduced.

The magnetron electrode can comprise or consist of a target comprising or consisting of material containing an oxide. Materials containing an oxide have the advantage that they provide an oxygen source. Extra oxygen is sometimes required in the sputtering area; for example, because the oxygen of the plasma source is not sufficient for oxidation or because higher coating rates are to be achieved. It is favorable in this case to take the oxygen directly from the target, i.e. from the magnetron electrode, because a higher stability thus results in comparison with a target of metal and with oxygen as the reactive gas. For normally, the reactive coating of a metallic (or silicon) target using reacting gas results in a rate instability if the oxygen partial pressure is not kept precisely constant since the rate of a metallic target can be considerably different from the rate of the corresponding oxide. If the reactive gas (oxygen, nitrogen) is contained in the target, the rate is independent of the covering with an oxide layer.

Preferred materials containing an oxide are $TiO_x$, $TaO_x$, $NbO_x$, $ZrO_x$, $ZrO_x:Y$, $HfO_x$, $AlO_x$, $SiO_x$, $ZnO_x$, $InSnO_x$ and/or $SnO_x$, with x particularly preferably being chosen so that the target just still has a conductivity, but x is simultaneously close to stoichiometry.

The spacing of the magnetron electrode from the substrate can amount to 2 to 10 cm, preferably 6 to 8 cm, particularly preferably 7 cm. The advantage of this spacing is that a homogeneous coating of small components is made possible with a high density and a high precision. The precision of the coating process falls with higher spacings from the magnetron electrode to the substrate.

In accordance with the invention, a spacing of 0.1 to 5 mm, preferably from 1 to 3 mm, particularly preferably of 2 mm, is provided between the boundary walls of the magnetron sputtering device and the turntable. This spacing has proved to be particularly favorable to design the magnetron sputtering device as gas-tight, i.e. to ensure an effective gas compartment separation within the apparatus.

The magnetron sputtering device can have a single magnetron arrangement. The magnetron sputtering device preferably has a double magnetron arrangement. The advantage of this arrangement is that more source material can be deposited per time which the substrate dwells in the magnetron sputtering device in comparison with a single magnetron arrangement. The result is a substantially higher efficiency of the sputtering process. Furthermore, better long-term stabilities can be ensured by the use of double magnetron arrangements with a bipolar excitation due to the "non-disappearing anode" and higher plasma densities in combination with denser (but also more stressed) layers can be ensured.

It can be advantageous in some cases also to use other discharges. For instance, a DC power supply with unipolar pulsing "DC pulsed" is particularly suitable for coating temperature-sensitive substrates such as polymers. The pulse frequency is also in the medium frequency range here. The reason is the lower ion energy and ion current density of a pulsed DC plasma in comparison with an MF plasma.

On the other hand, it is known that it is also possible to work with RF discharges. The frequency 13.56 MHz is customary. They are not normally preferred since the costs are higher for this type of generators. It is, however, advantageous that the RF sputtering can also be used for insulating target materials. This is e.g. the case for $SiO_x$, $AlO_x$, but also for other oxides, nitrides or also for fluoride targets. $MgF_2$ or other fluorides could thus be sputtered, for example. The process stability can therefore be increased again since work can be carried out with stoichiometric targets. It is advantageous in this respect that the back-coating (insulating) areas which form do not present any problems due to discharges (arcing); the layers can thus be deposited very free of particles.

Consequently, the apparatus can advantageously have a DC power supply (DC, a pulsed DC power supply (DC pulsed)) or an apparatus for producing HIPIMS, medium frequency or RF discharges.

In a further preferred embodiment, the apparatus preferably comprises two, optionally also three, magnetron sputtering devices. The advantage of such embodiments above all results with multilayer coatings, i.e. on the coating of a substrate with a plurality of different layers. In this case, stacks of two layer types which comprise different material (source material) can be generated with two magnetron sputtering devices. Consequently, the possibility is given in the case of three magnetron sputtering devices of sputtering stacks of three kinds of layers onto the substrate which layers comprise different material. Furthermore, material mixtures of the respective source materials can also be produced, i.e. mixed layers can be deposited. The use of two magnetron sputtering devices for optimizing the layer properties is in particular very advantageous in the area of very complex optical multilayer filters having more than 100 single layers. Depending on the demands (e.g. special design), three or more magnetron sputtering devices can also prove advantageous.

The magnetron sputtering device can have an effective gas compartment separation for gases within the vacuum of 1:25; 1:100 is better. An effective gas compartment separation between the coating stations of 1:100 makes possible a production of clearly defined co-sputtered materials. The reason for this is that noble gas and/or reactive gas of a magnetron sputtering device is prevented from moving into a further magnetron sputtering device thereof. In addition, the quantity of noble gas and/or reactive gas can be set more precisely to a specific predefined value and/or kept constant by the effective gas compartment separation.

Plasmas on a magnetron discharge base as a rule comprise more than 99% non-ionized particles. They can have high energies and therefore make a high contribution to layer stresses. They can be indirectly influenced, for example, by changing the magnetic field design or by the use of alternative sputtering gases. In accordance with the invention, the sputtering gas can comprise or consist of a noble gas. Preferred noble gases are argon, neon, xeon and krypton. Noble gas mixtures are also possible.

In accordance with the invention, the reactive gas can comprise or consist of an oxidizing gas. Oxygen, nitrogen, tetrafluoromethane, octafluorocyclobutane, carbon dioxide and hydrogen fluoride are preferred reactive gases. Mixtures of these gases can also be used.

The apparatus preferably comprises a photometer and/or an ellipsometry flange. It is thereby made possible to photometrically monitor the thickness of the layer on the substrate during the sputtering process. For this purpose, a fast broadband measurement (e.g. of 300-1000 nm) of the transmission or of the reflection can be carried out. The layer thickness can be determined and monitored by a comparison with the spectrum theoretically to be expected. In some cases, a quartz crystal can additionally also be used, for example with cavity filters in which only a small signal change of the transmission is expected with certain layers.

Alternatively, an ellipsometry measurement can also be carried out. It has to be carried out at an angle of incidence between about 55° and 75° to the normal, preferably at 65°. The in situ ellipsometry is also very advantageous to determine the dispersion of the refractive index (and optionally of the absorption index) since this has to be known exactly in the broadband monitoring with a transmission measurement or a reflection measurement. It is often also sufficient in in situ ellipsometry measurement to use it in a static state, i.e. with a stopped turntable, to measure the respective deposited finished layer. The method is therefore suitable for calibration.

Components often have to be realized which exert a polarization effect. In this respect, for example, defaults are set for reflection or for transmission for polarized light. Tp and Ts are in this respect the components of the transmission polarized parallel with or perpendicular to the plane of incidence; Rp and Rs are the components of the reflection polarized parallel with or perpendicular to the plane of incidence. These components can thus be used with an oblique incidence (e.g. 45°, 60°, . . . ) into the apparatus in accordance with the invention.

It is advantageous for the production of coatings which are to work at an oblique angle of incidence if the monitoring of the layer likewise takes place at an oblique angle of incidence. Ellipsometry is frequently too slow to carry out a fast measurement, particularly at the high frequencies of rotation aimed for here. The measurement of the Rp and Rs (or Tp and Ts) components can therefore be used very advantageously here. The measurement can in this respect take place at an angle of incidence of 45°, with a statically arranged polarizer being used. Two beam paths can be used for two polarizations.

Alternatively, a component of the polarization can also be selected and the spectrum can be combined with the transmission measured at perpendicular incidence. The same short measurement time (in the msec range) is thus reached as in the transmission measurement.

The combination of the measurement with polarized light is also particularly suitable to monitor thin metallic layers (e.g. silver or aluminum) which are used with polarizing beam splitters, for example.

In a further preferred embodiment of the apparatus, the substrate holder of the turntable comprises or consists of polyether ether ketone. The use of polyether ether ketone has the advantage that the particle formation is reduced.

BRIEF DESCRIPTION OF THE DRAWINGS

The subject matter in accordance with the invention will be explained in more detail with reference to the following Figures and examples without intended to restrict it to the specific embodiments shown here.

DETAILED DESCRIPTION OF THE INVENTION

Figure 1:
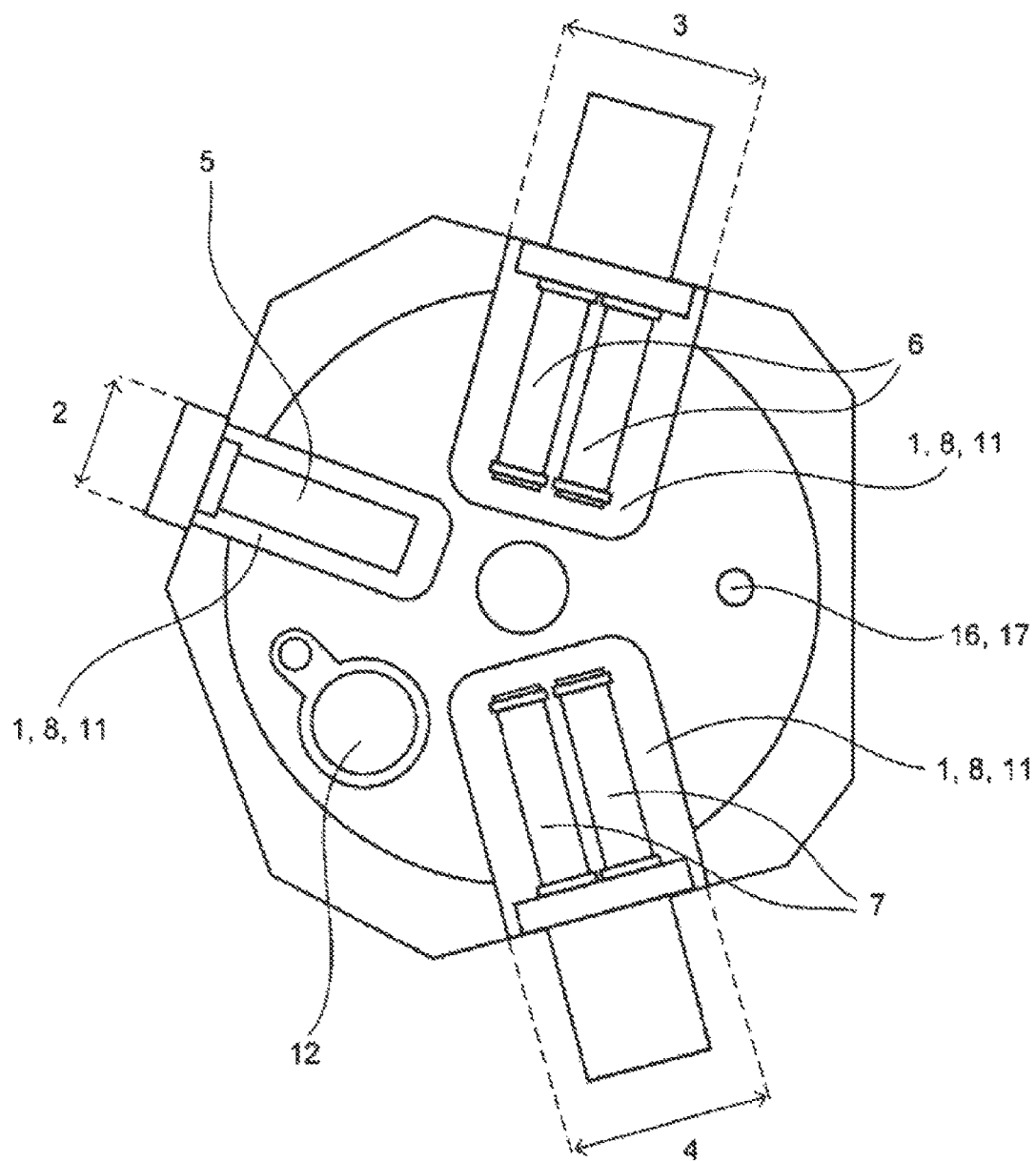
FIG. 1 shows a sketch of a preferred apparatus in accordance with the invention without a turntable in a plan view.

FIG. 1 schematically shows a preferred apparatus in accordance with the invention without a turntable in a plan view. The apparatus has three magnetron sputtering devices 2, 3, 4, of which one is designed in the single magnetron arrangement 2 and two in the double magnetron arrangement 3, 4. The magnetron sputtering device 2 comprises a magnetron electrode 5, sputtering gas 11 and optionally reactive gas 8 and is in a vacuum 1. The magnetron sputtering devices 3, 4 each comprise two magnetron electrodes 6, 7, sputtering gas 11 and optionally reactive gas 8 and are in a vacuum 1. A plasma source 12 and a photometer 16 and/or an ellipsometry flange 17 are located in the vicinity of the magnetron sputtering devices 2, 3, 4.

Figure 2:
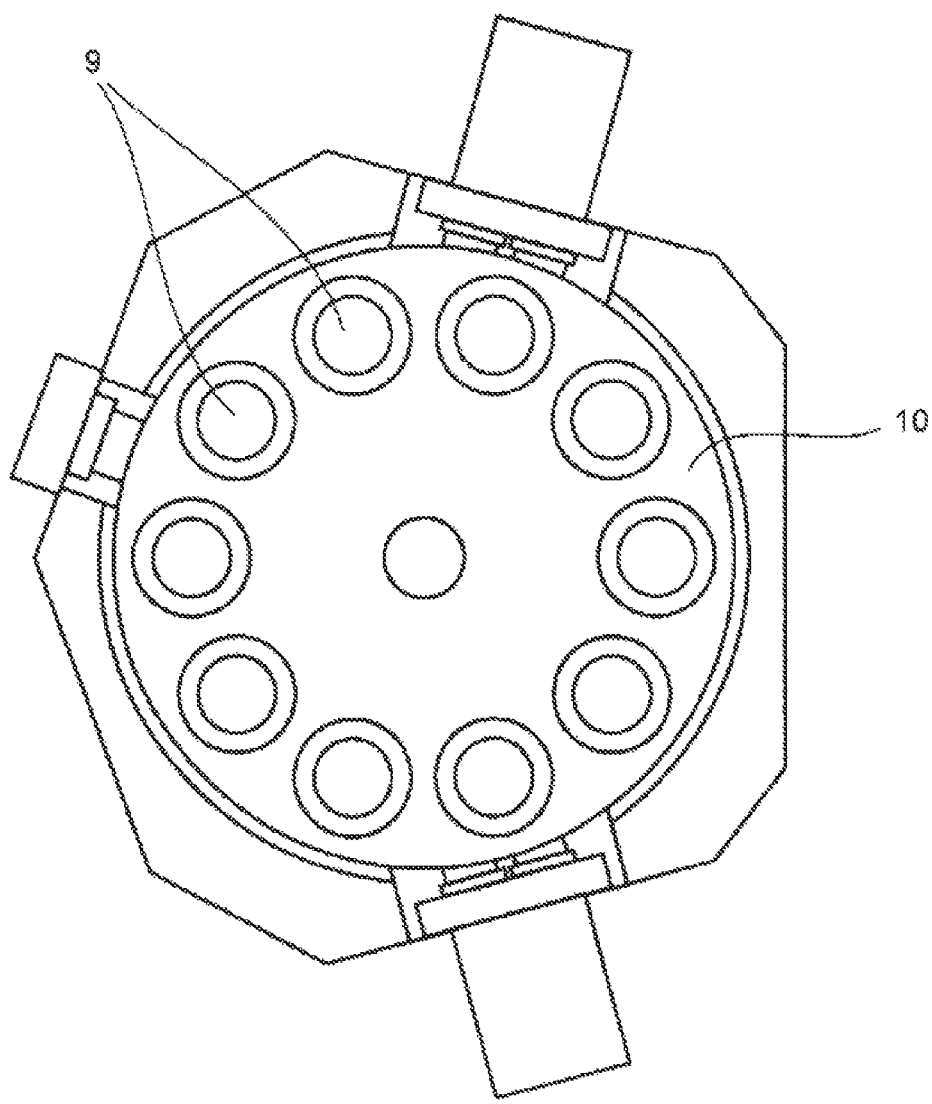
FIG. 2 shows a sketch of a preferred apparatus in accordance with the invention with a turntable in a plan view.

FIG. 2 schematically shows a preferred embodiment of the turntable in a plan view. The turntable 10 is located in the apparatus and in this example has ten identical substrate holders 9.

Figure 3:
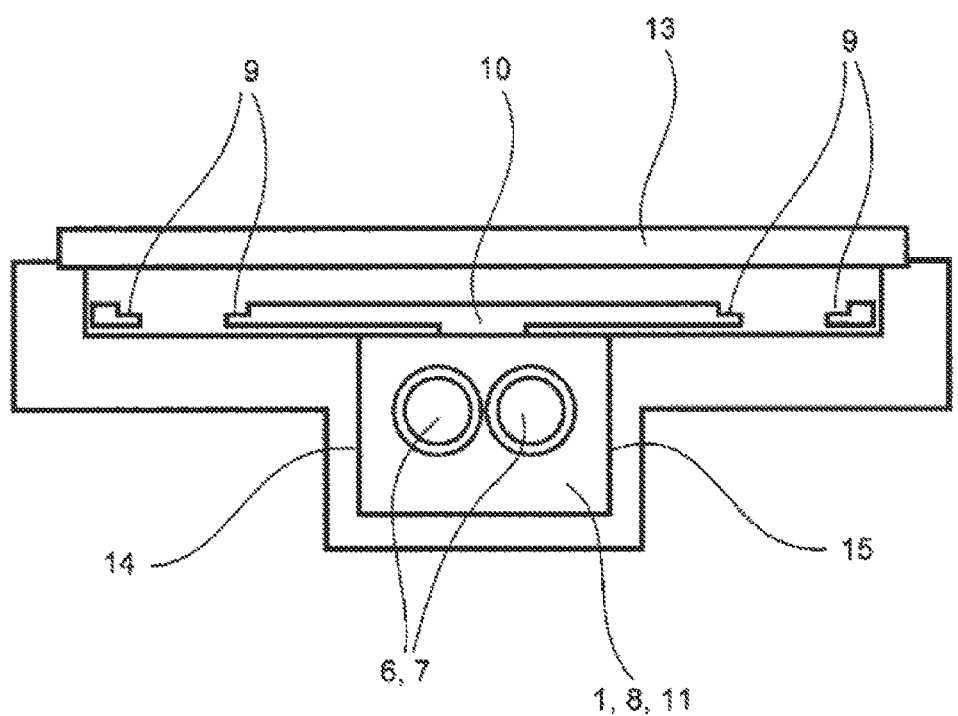
FIG. 3 shows a sketch of a preferred apparatus in accordance with the invention with a turntable in a side view.

FIG. 3 schematically shows a preferred embodiment of the apparatus with a turntable 10 in a side view. The cross-section of a magnetron sputtering device is visible which comprises two cylinders of source material 6, 7 (double magnetron arrangement). The magnetron sputtering device is delineated in a gas-tight manner from the rest of the apparatus at the sides of boundary walls 14, 15 and at the top by the turntable 10; it comprises sputtering gas 11, optionally reactive gas 8; and is at a vacuum 1. Two substrate holders 9 of the turntable 10 are shown or visible in the cross-section. A cover 13 is located above the turntable 10 and has boundary walls which are located to the side of the turntable 10; said turntable closes the apparatus in a gas-tight manner.

The invention claimed is:

1. A method for producing low-particle layers on moved substrates in a vacuum chamber by means of at least one magnetron sputtering device, wherein the layers are formed from cylindrical source material of at least one magnetron electrode, the method including the following steps:
    immobilizing the substrate by means of a substrate holder on a turntable and
    depositing at least one layer of source material on the substrate utilizing a sputtering gas in at least one magnetron sputtering device;
    wherein the turntable rotates so that the magnetron sputtering device can be controlled and the cylindrical source material of the magnetron electrode is deposited onto the substrate upwardly against gravity; wherein the cylindrical source material is free of erosion trenches;
    wherein the process pressure in the magnetron sputtering device lies in the range from $3 \cdot 10^{-4}$ to $5 \cdot 10^{-2}$ mbar; and
    wherein the partial pressure of the sputtering gas and/or of the reactive gas in the magnetron sputtering device is regulated and/or stabilized via a generator, wherein the spacing between the turntable and the boundary walls of the magnetron sputtering device is to 0.1 to 5 mm, and wherein the substrate has a spacing from the magnetron electrode from 7 to 10 cm.

2. The method in accordance with claim 1, wherein at least one plasma source is utilized in the method.

3. The method in accordance with claim 2, wherein the at least one plasma source pretreats the surface of the substrate via plasma action.

4. The method in accordance with claim 2, wherein the at least one plasma source modifies the structure and/or the stoichiometry of the layer via plasma action.

5. The method in accordance with claim 2, wherein the at least one plasma source is controlled via a turntable.

6. The method in accordance with claim 2, wherein the partial pressure of the sputtering gas and/or of the reactive gas in the magnetron sputtering device is regulated and/or stabilized via a regulation of the generator power, of the generator voltage and/or of the generator current.

7. The method in accordance with claim 2, wherein the magnetron sputtering device is operated with a DC supply (DC), a pulsed DC supply (DC pulsed), HIPIMS, medium frequency or RF discharges.

8. The method in accordance with claim 2, wherein, for the process control, the thickness of the layer on the substrate is monitored by
   a) optical transmission monitoring;
   b) optical reflection monitoring;
   c) optical absorption monitoring;
   d) single wavelength ellipsometry or spectral ellipsometry; and/or
   e) crystal quartz measurement.

9. The method in accordance with claim 2, wherein the temperature of a heatable element at the cover is set in dependence on the layer to be produced and/or is varied during the coating process.

10. An apparatus for producing low-particle layers on at least one moved substrate in a vacuum by means of magnetron atomization, comprising
   a) at least one magnetron sputtering device having at least one magnetron electrode of cylindrical source material, a generator, and a sputtering gas; wherein the cylindrical source material is free of erosion trenches;
   b) a cover; and
   c) a turntable having at least one substrate holder;
   wherein the cover closes the apparatus in a gas-tight manner and the turntable closes the magnetron sputtering device in a gas-tight manner, wherein the magnetron sputtering device is aligned so that it deposits material of the magnetron electrode in the direction of the substrate against gravity and the process pressure in the magnetron sputtering device lies in the range from $3\cdot10^{-4}$ to $5\cdot10^{-2}$ mbar, wherein the spacing between the turntable and the boundary walls of the magnetron sputtering device is to 0.1 to 5 mm, and wherein the substrate has a spacing from the magnetron electrode from 7 to 10 cm.

11. The apparatus in accordance with claim 10, wherein the apparatus comprises at least one plasma source.

12. The apparatus in accordance with claim 10, wherein the turntable is positioned above the magnetron sputtering device.

13. The apparatus in accordance with claim 10, wherein the magnetron electrode comprises or consists of a target comprising or consisting of
   a) ceramic material or ceramic material mixtures;
   b) thermally sprayed material or thermally sprayed material mixtures;
   c) crystalline material;
   d) metallic material or metallic material mixtures; and/or
   e) a material containing an oxide;
   or mixtures thereof.

14. The apparatus in accordance with claim 10, wherein the magnetron sputtering device is configured in a single magnetron arrangement or in a double magnetron arrangement.

15. The apparatus in accordance with claim 10, wherein the apparatus has a DC power supply (DC), a pulsed DC power supply (DC pulsed) or an apparatus for producing HIPIMS, medium frequency or RF discharges.

16. The apparatus in accordance with claim 10, wherein the apparatus has two or three magnetron sputtering devices.

17. The apparatus in accordance with claim 10, wherein the magnetron sputtering device has an effective gas compartment separation for gases of 1:25 within the vacuum.

18. The apparatus in accordance with claim 10, wherein the sputtering gas comprises and/or consists of a noble gas; and/or the reactive gas comprises or consists of a gas selected from oxygen, nitrogen, tetrafluoromethane, octafluorocyclobutane, carbon dioxide and hydrogen fluoride.

19. The apparatus in accordance with claim 10, wherein the apparatus comprises a photometer, an ellipsometry flange, and/or a component which exerts a polarization effect.

20. The apparatus in accordance with claim 10, wherein the substrate holder of the turntable comprises or consists of polyether ether ketone.

21. A method for producing low-particle layers on moved substrates in a vacuum chamber by means of at least one magnetron sputtering device, wherein the layers are formed from cylindrical source material of at least one magnetron electrode, wherein the following steps are provided:
   immobilizing the substrate by means of a substrate holder on a turntable; and
   depositing at least one layer of source material on the substrate utilizing a sputtering gas in at least one magnetron sputtering device;
   wherein the turntable rotates so that the magnetron sputtering device can be controlled and the cylindrical source material of the magnetron electrode is deposited onto the substrate upwardly against gravity, wherein the cylindrical source material is free of erosion trenches; and
   wherein the process pressure in the magnetron sputtering device lies in the range from $3\cdot10^{-4}$ to $5\cdot10^{-2}$ mbar; and wherein the partial pressure of the sputtering gas and/or of the reactive gas in the magnetron sputtering device is regulated and/or stabilized via a generator and wherein the spacing between the turntable and the boundary walls of the magnetron sputtering device amounts to 0.1 to 3 mm and wherein the substrate has a spacing from the magnetron electrode from 7 to 10 cm.

22. An apparatus for producing low-particle layers on at least one moved substrate in a vacuum by means of magnetron atomization, comprising
   a) at least one magnetron sputtering device having at least one magnetron electrode of cylindrical source material, a generator; sputtering gas, wherein the cylindrical source material is free of erosion trenches;
   b) a cover;
   c) a turntable having at least one substrate holder;
   wherein the cover closes the apparatus in a gas-tight manner and the turntable closes the magnetron sputtering device in a gas-tight manner, wherein the magnetron sputtering device is aligned so that it deposits material of the magnetron electrode in the direction of the substrate against gravity and the process pressure in the magnetron sputtering device lies in the range from $3\cdot10^{-4}$ to $5\cdot10^{-2}$ mbar and wherein the spacing between the turntable and the boundary walls of the magnetron sputtering device amounts to 0.1 to 3 mm and wherein the substrate has a spacing from the magnetron electrode from 7 to 10 cm.

\* \* \* \* \*